(12) United States Patent
Kobayashi et al.

(10) Patent No.: US 7,019,444 B2
(45) Date of Patent: Mar. 28, 2006

(54) METHOD OF ADJUSTING TEMPERATURE PROPERTIES OF PIEZOELECTRIC DEVICES AND OSCILLATION CIRCUITS

(75) Inventors: Yoshihiro Kobayashi, Komagane (JP); Nobuyuki Imai, Suwa (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/885,167

(22) Filed: Jul. 1, 2004

(65) Prior Publication Data

US 2005/0001518 A1   Jan. 6, 2005

Related U.S. Application Data

(62) Division of application No. 10/197,243, filed on Jul. 17, 2002, now Pat. No. 6,777,854.

(30) Foreign Application Priority Data

Jul. 17, 2001   (JP) .............................. 2001-217238

(51) Int. Cl.
  *H01L 41/18* (2006.01)
  *H03H 9/19* (2006.01)
(52) U.S. Cl. .................. 310/361; 310/360; 310/313 A
(58) Field of Classification Search ............ 310/313 A, 310/313 R, 360, 361
See application file for complete search history.

(56) References Cited

U.S. PATENT DOCUMENTS

| | | | |
|---|---|---|---|
| 4,503,353 A * | 3/1985 | Hermann | 310/361 |
| 4,926,086 A * | 5/1990 | Bourgeois et al. | 310/361 |
| 5,196,758 A * | 3/1993 | Hermann | 310/361 |
| 5,895,996 A | 4/1999 | Takagi et al. | 310/313 R |
| 6,316,861 B1 * | 11/2001 | Ballandras et al. | 310/313 A |
| 6,744,182 B1 * | 6/2004 | Branham | 310/361 |
| 6,777,854 B1 * | 8/2004 | Kobayashi et al. | 310/313 A |
| 6,784,595 B1 * | 8/2004 | Iizawa et al. | 310/311 |
| 2003/0030513 A1 | 2/2003 | Yamazaki et al. | |
| 2003/0052572 A1 | 3/2003 | Iizawa et al. | |

FOREIGN PATENT DOCUMENTS

| | | |
|---|---|---|
| EP | 1292023 | 3/2003 |
| JP | 59-055616 | 3/1984 |
| JP | 11-122038 | 4/1999 |
| JP | 2000-040918 | 2/2000 |
| JP | 2000-188521 | 7/2000 |
| WO | WO 96/10293 | 4/1996 |

* cited by examiner

*Primary Examiner*—Thomas M. Dougherty
(74) *Attorney, Agent, or Firm*—Harness, Dickey & Pierce, P.L.C.

(57) ABSTRACT

A method of adjusting the temperature properties of piezoelectric devices and oscillation circuits which have a third-order function temperature property and the point of inflection of the third-order function temperature property outside the normal usage temperature range. The local maximum point or local minimum point temperature located in the normal temperature range is regarded as the peak temperature of the apparent second-order function temperature property, and the peak temperature is adjusted to the optimum value in the normal temperature range by rotating the temperature property around the point of inflection located outside the normal temperature range by adjusting the first-order coefficient.

10 Claims, 9 Drawing Sheets

1: Quartz plate
2: Quartz Z plate
3: Elastic surface wave chip
$\psi$ : In-plane rotation axis

METHOD OF ADJUSTING TEMPERATURE PROPERTIES OF PIEZOELECTRIC DEVICES AND OSCILLATION CIRCUITS

CROSS REFERENCE TO RELATED APPLICATIONS

This application is a divisional patent application of U.S. Ser. No. 10/197,243 filed Jul. 17, 2002 now U.S. Pat. No. 6,777,854, claiming priority to Japanese Application No. 2001-217238 filed Jul. 17, 2001, all of which are hereby incorporated by reference.

BACKGROUND OF THE INVENTION

1. Technical Field

This invention relates to a method of adjusting the temperature properties of piezoelectric devices and oscillation circuits, especially a method of adjusting the temperature properties of the SAW device and oscillation circuits where it is mounted.

2. Prior Art

Figure 9:
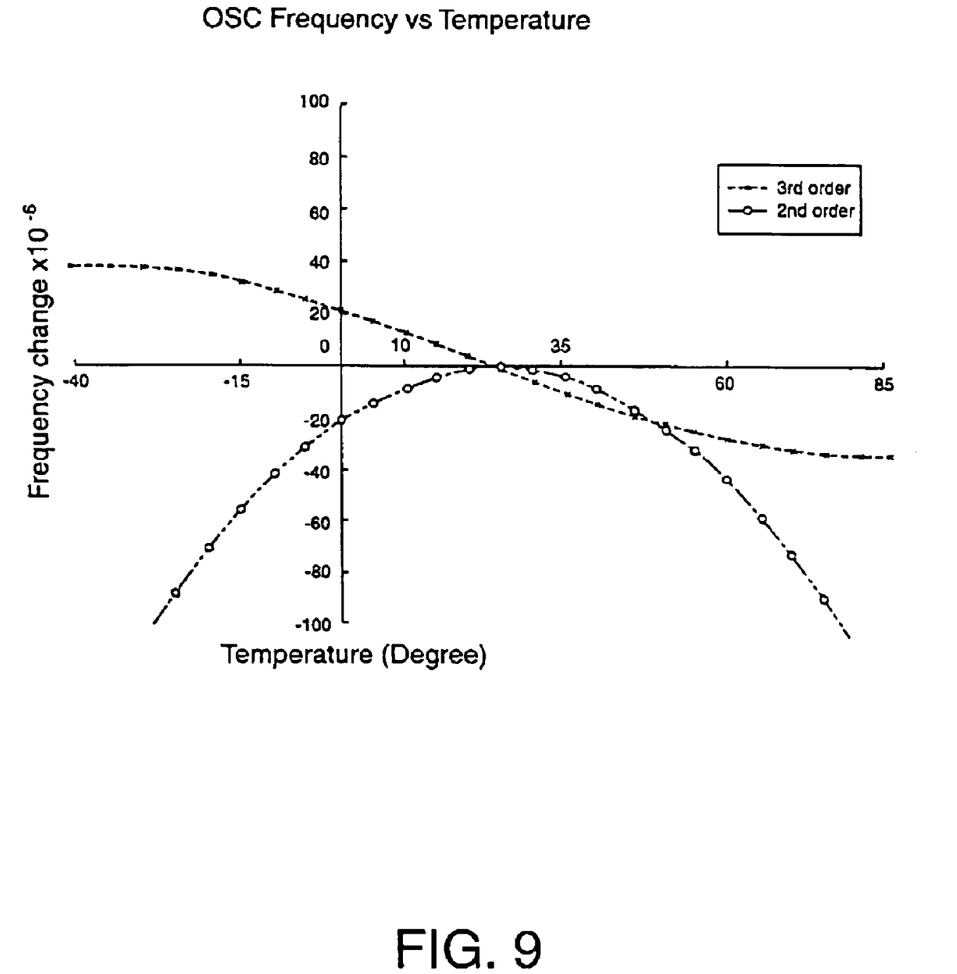
FIG. 9 is an illustration of conventional second-order function temperature property and third-order function temperature property.

Conventionally, the temperature properties (frequency variation properties against the temperature variation) of piezoelectric resonators are expressed, as shown in FIG. 9, in terms of a second-order function such as in the tuning fork resonator and the SAW resonator in some and a third-order function such as in the AT resonator in others.

In the frequency temperature property of an oscillation circuit using this piezoelectric resonator, the oscillation circuit temperature property and the resonator temperature property are adjusted so that the temperature properties become minimal in the usage temperature range (−40 to +85° C.) centering on the normal usage temperature of 25° C. Normally, in an oscillator which has a piezoelectric resonator with a second-order function temperature property, if it is adjusted so that the peak temperature of the oscillation circuit temperature property becomes located in the center of the usage temperature range, the temperature stability becomes minimum. In a conventional resonator with a second-order function temperature property, the adjustment width of the peak temperature is about 0° C. to 40° C. On the other hand, because the point of inflection temperature cannot be easily adjusted in an AT-cut resonator etc. which have a third-order function temperature property, the first-order coefficient term is generally adjusted so that the oscillation circuit temperature property in the usage temperature range comes to have the minimum width. In actuality, the electrode film thickness and width are adjusted in the former piezoelectric resonator with a second-order function temperature property, and electrode forming direction (X-axis direction) is adjusted so that the rotation is centered on its inflection point in the latter resonator with a third-order function temperature property.

Figure 8:
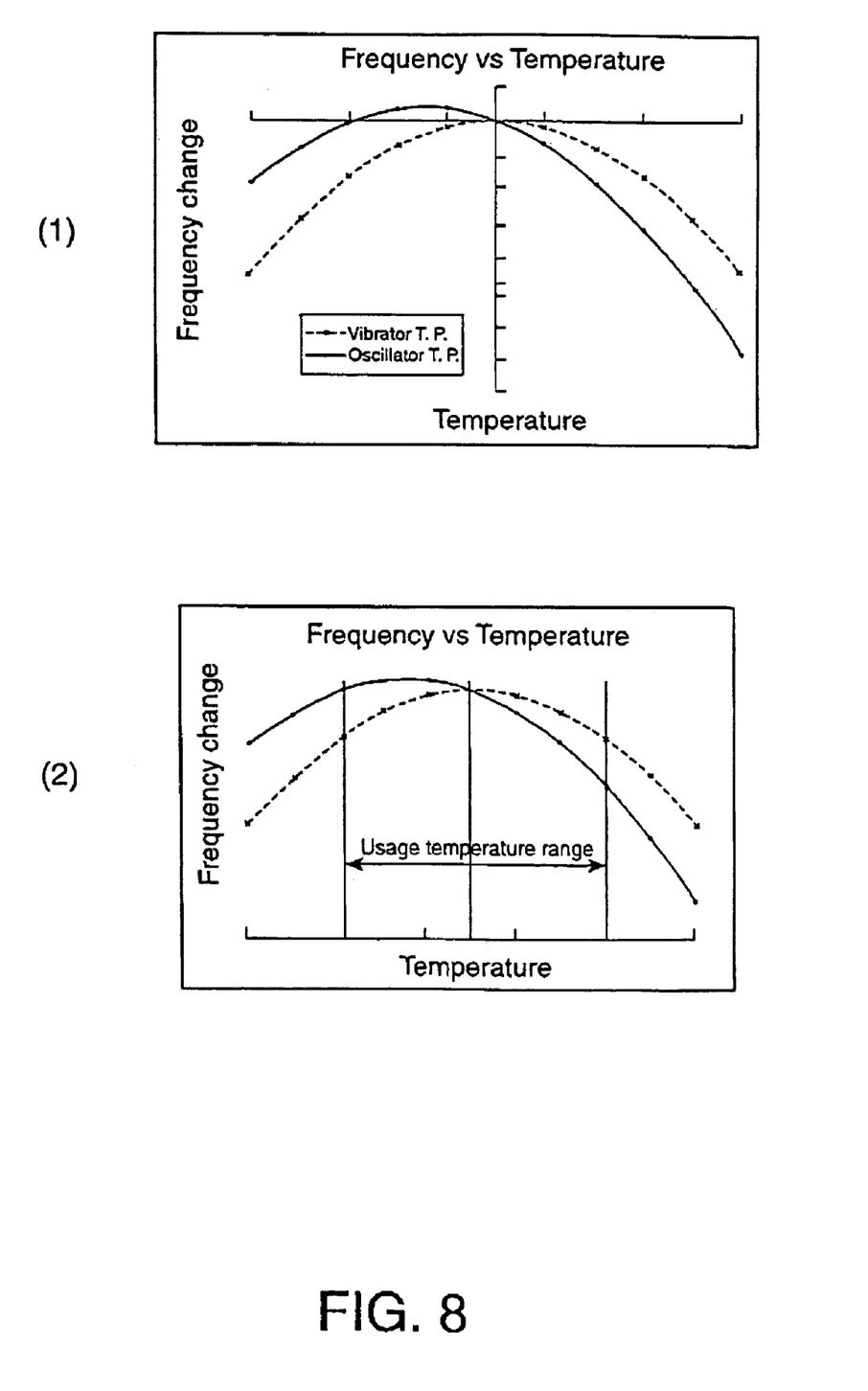
FIG. 8 is an illustration of the adjustment work of a second-order function temperature property.

If an oscillation circuit is configured using a resonator with a second-order function temperature property, as shown in FIG. 8, the temperature property of the oscillation circuit is different from temperature property of the resonator in general. The temperature property seems to rotate in the clockwise direction or counter-clockwise direction. This is because the first-order coefficient of the temperature property varies. Although this variation of the temperature property contains not only a variation in the first-order coefficient but also a variation in the higher-order coefficients, it can be represented by a variation in the first-order coefficient in general. If the oscillator frequency and the temperature properties are minimized, as stated above, the peak temperature of the second-order function temperature property is adjusted to the center of the usage temperature range in general. However, the adjustment range of the peak temperature of a resonator is not free, and the adjustable range is limited.

Figure 7:
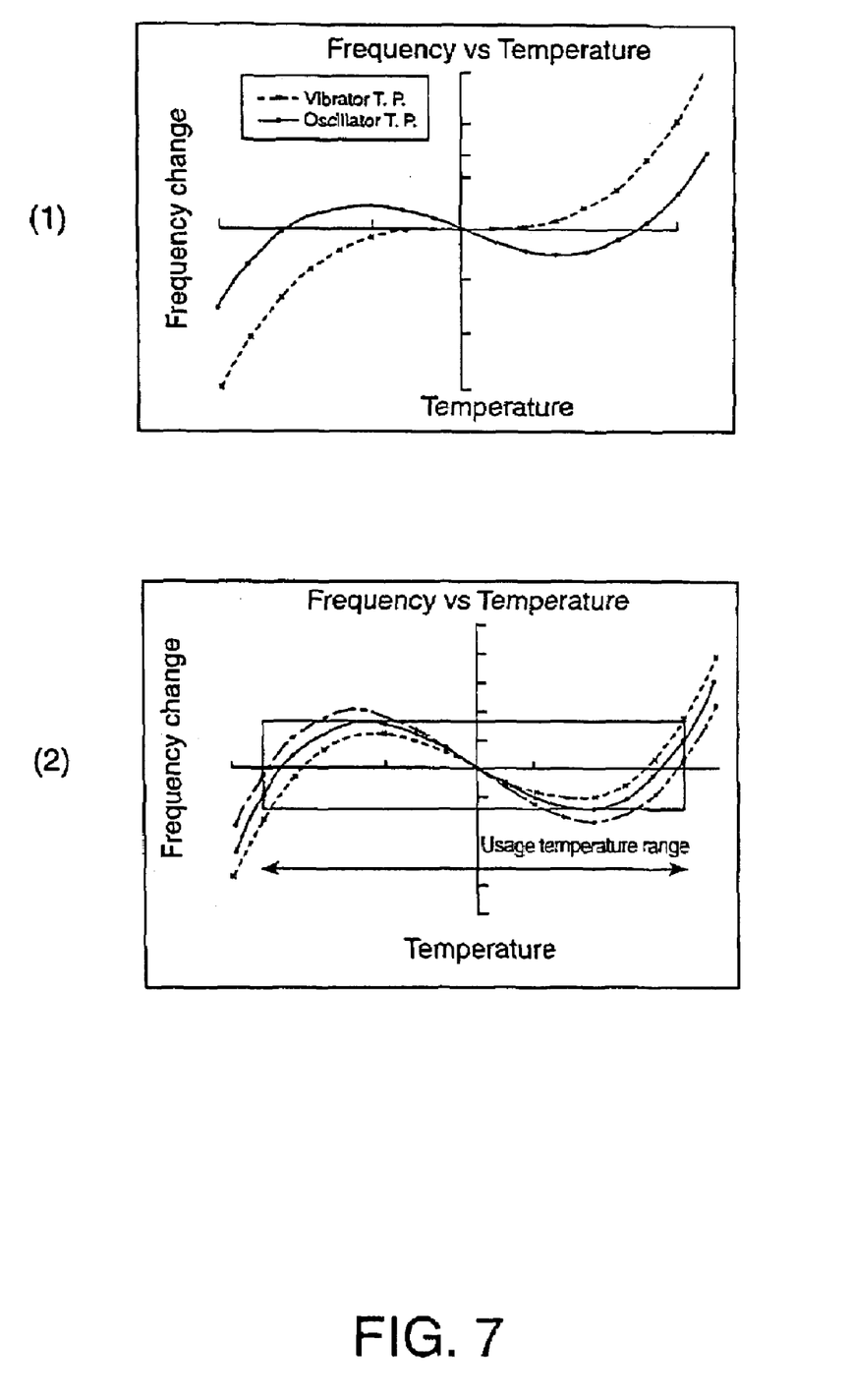
FIG. 7 is an illustration of the adjustment work of a third-order function temperature property.

On the other hand, if an oscillation circuit is configured using a resonator with a third-order function temperature property, as shown in FIG. 7, the temperature property of the oscillation circuit is different from the temperature property of the resonator in general. In the same way as in the case of the second-order property, the temperature property seems to rotate in the clockwise direction or counter-clockwise direction. In the case of the third-order function temperature property, moving the point of inflection temperature is difficult. Therefore, if the oscillator frequency and the temperature properties are minimized, it is arranged so that the minimum temperature property in the usage temperature range is obtained by adjusting the first-order coefficient of the resonator in general.

If the usage temperature range of an oscillator is mis-distributed relative to the temperature property adjustment range of the resonator, especially if the peak temperature of the second-order function temperature property cannot be set to the center of the usage temperature range, or if the point of inflection temperature of the third-order function temperature property is off the center of the usage temperature range, it is difficult to adjust so that the temperature property comes to have the minimum temperature width in the usage temperature range. Also, the SAW resonator normally has a second-order function temperature property, and as a method of improving the temperature property of the oscillation circuit, there is only one method where the peak temperature is brought to the center of the usage temperature range.

This invention has an objective of providing a method of adjusting the temperature properties of piezoelectric devices and oscillation circuits which can make the temperature properties of oscillation circuits flatter in the usage temperature range by using the property in the lower temperature range than the point of inflection of resonators with third-order function temperature properties.

SUMMARY OF THE INVENTION

In order to achieve the objective, the method of adjusting the temperature property of the piezoelectric device of this invention was configured as follows. Namely, a method of adjusting the temperature properties of piezoelectric devices which have a third-order function temperature property and the point of inflection of the third-order function temperature property outside the normal usage temperature range, the local maximum point or local minimum point temperature located in the normal temperature range is regarded as the peak temperature of the apparent second-order function temperature property, and the peak temperature was adjusted to the optimum value in the normal temperature range by rotating the temperature property around the point of inflection located outside the normal temperature range by adjusting the first-order coefficient.

Also, a method of adjusting the temperature properties of piezoelectric devices made of an in-plane rotated ST-cut quartz plate which is obtained by rotating a quartz plate around the electrical axis (X axis) and further rotated in a plane around the Z' axis, the local maximum point or local minimum point temperature of the temperature property can also be adjusted to the optimum value in the normal temperature range by adjusting the in-plane rotation angle.

Further, a method of adjusting the temperature properties of piezoelectric devices made of an ST-cut quartz plate which is obtained by rotating a quartz plate around the electrical axis (X axis) and further rotated in a plane around the Z' axis, is characterized by the fact that an ST-cut quartz plate rotated in plane around the Z' axis is regarded as a third-order function temperature property. Further, that an adjustment of the temperature property in the normal temperature range is performed by rotating the temperature property around the point of inflection located outside the normal temperature range through adjusting the in-plane rotation angle to adjust the local maximum point or local minimum point of the temperature property to the optimum value in the normal temperature range as the peak temperature of an apparent second-order function temperature property.

In the configuration, the ST-cut quartz plate rotated in a plane around the Z' axis is at θ=113 to 135 degrees and Ψ=43±5 degrees in the Euler angle. Also, the normal temperature range is set to −40 to +80° C.

The method of adjusting the temperature properties of oscillation circuits of this invention is a method of adjusting the temperature properties of oscillation circuits where embedded is a piezoelectric device which has a third-order function temperature property and an inflection point of the third-order function temperature property outside the normal usage temperature range. Further, it is characterized by the fact that while the temperature property of the piezoelectric device is measured, the temperature property of the oscillation circuit is also measured to obtain their difference, the resonator temperature property which gives the temperature property required to the oscillation circuit is predicted, the local maximum point or local minimum point temperature located in the normal temperature range of the piezoelectric device is regarded as the peak temperature of an apparent second-order function temperature property so as to give the predicted temperature property, and the temperature property is rotated around the point of inflection located outside the normal temperature range through adjusting the first-order coefficient to adjust the peak temperature to the optimum value in the normal temperature range.

Also, the method of adjusting the temperature properties of oscillation circuits of this invention is configured so that the oscillation circuit is configured with a lower temperature range than the point of inflection of the third-order function temperature property of a piezoelectric resonator made of an in-plane rotated ST-cut quartz plate which is obtained by rotating a quartz plate around the electrical axis (X axis) further rotated in plane around the Z' axis, and that the local maximum point or local minimum point temperature is regarded as the apparent peak temperature of the second-order function temperature property to adjust the frequency property of the oscillation circuit.

Also, this invention is a method of adjusting the temperature properties of oscillation circuits where embedded is an in-plane rotated ST-cut quartz plate which is obtained by rotating a quartz plate around the electrical axis (X axis) and further rotated in a plane around the Z' axis, and it may have a configuration where the temperature properties of the ST-cut quartz plate rotated in plane and the oscillation circuit where embedded is the ST-cut quartz plate rotated in a plane are obtained, and that the temperature property of the ST-cut quartz plate rotated in a plane is adjusted so that their difference is canceled. In this case, the usage temperature range of the oscillation circuit is −40 to +85° C.

DETAILED DESCRIPTION OF THE PREFERRED EMBODIMENTS

Explained in detail below is a specific embodiment of the temperature property adjustment method of piezoelectric devices and oscillation circuits of this invention, referring to the drawings.

In general, the second-order function temperature properties are common in SAW resonators, by using a piezoelectric resonator with a third-order function temperature property, having the point of inflection temperature located in a temperature region higher (or lower) than the usage temperature range, and adjusting the oscillation circuit temperature property using the temperature property near the local maximum point of the third-order function temperature property as the usage temperature range, an oscillator temperature property with a small temperature variation width can be realized.

Figure 1:
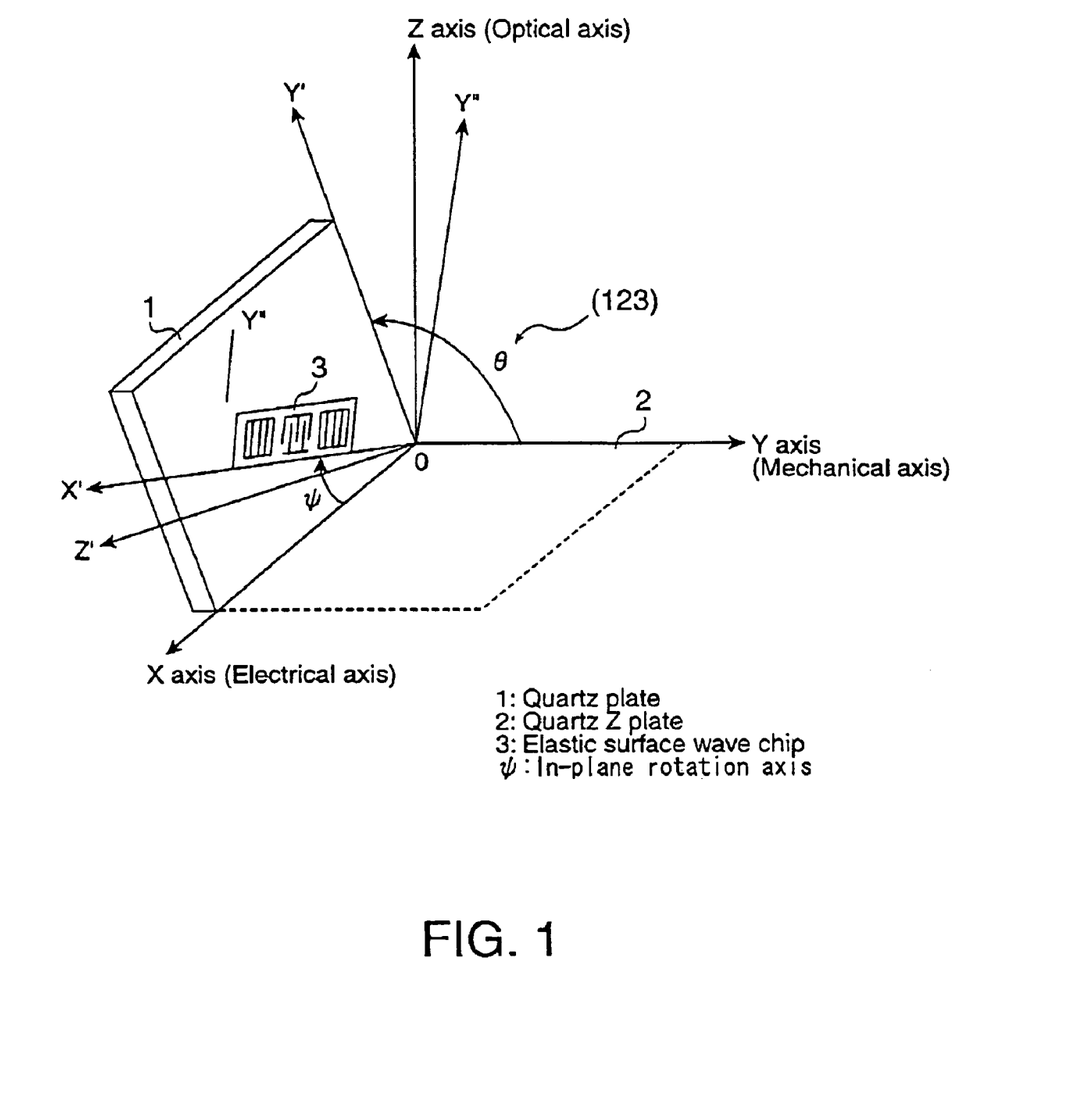
FIG. 1 is an illustration of an ST-cut quartz rotated in plane around the Z' axis.

For example, when cutting a piezoelectric resonator out of quartz, the temperature property changes depend on the cutting direction. Crystal axes of quartz are defined as the electrical axis (X axis), mechanical axis (Y axis), and optical axis (Z axis) as shown in FIG. 1, and the so-called ST cut indicates cutting along the crystal axis (X, Y', Z') of the quartz plate 1 obtained by rotating a quartz Z plate 2 whose Euler angle (f, θ, Ψ)=(0, 0, 0) around the electrical axis (X axis) by θ=113 to 135 degrees. A piezoelectric resonator manufactured by further rotating this ST-cut quartz plate 1 around the Z' axis by Ψ=43±5 degrees so that the propagation direction of the elastic surface wave becomes the direction of this Ψ is called an ST-cut quartz resonator 3 rotated in plane around the Z' axis. This in-plane rotated ST-cut quartz resonator 3 has a small frequency variation rate and an extremely good temperature property. It was believed that it is a kind of ST cut and its temperature property is a second-order function temperature property. However, when the inventors examined it, it turned out that it is a third-order function temperature property whose inflection point exists near 110 degrees. If the point of inflection is outside the actual usage temperature range, because examining the temperature property in such a temperature region may damage other chips constituting the oscillator, it was practically impossible to check the existence of the point of inflection. Therefore, when trying to adjust the temperature property of a resonator cut out of this ST-cut quartz plate rotated in plane around the Z' axis, an adjustment was extremely difficult even if it was performed as a second-order function temperature property.

This embodiment is configured so that by knowing that an ST-cut quartz resonator rotated in plane around the Z' axis has a third-order function temperature property, and concerning the local maximum point or local minimum point temperature located in the normal temperature range as the apparent peak temperature of the second-order function temperature property, the peak temperature is adjusted to the optimum value in the normal temperature range by rotating the temperature property around the point of inflection located outside the normal temperature range through adjusting the first-order coefficient term. Specifically, the temperature property is adjusted by adjusting the local maximum point or local minimum point temperature of the temperature property to the optimum value of the normal temperature range by adjusting the in-plane rotation angle of a piezoelectric device made of an ST-cut quartz plate which is obtained by rotating a quartz plate around the electrical axis (X axis) by $\theta=113$ to 135 degrees and further rotated in a plane around the Z' axis by $\Psi=43\pm5$ degrees.

Figure 2:
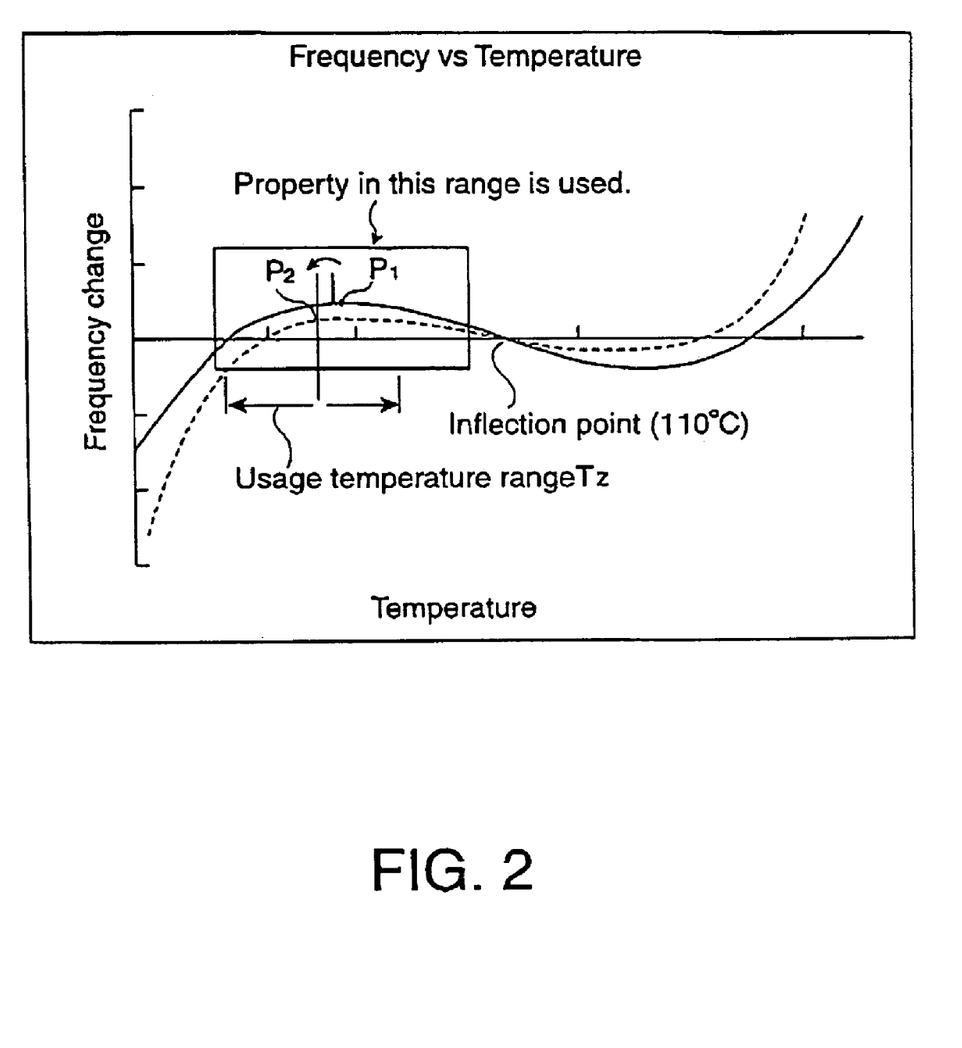
FIG. 2 is a temperature property plot of an ST-cut quartz resonator rotated in plane around the Z' axis.

Now, as shown in FIG. 2, because the temperature property of an ST-cut quartz resonator rotated in plane around the Z' axis has an inflection point around 110° C. and the normal temperature range is in a lower temperature region of −40 to 85° C., the property region having the local maximum point located in a lower temperature region than the point of inflection is used (the part surrounded with a rectangle in FIG. 2). Because it is difficult to move an inflection point in the case of a third-order function temperature property, the first-order coefficient term is adjusted to rotate the property curve around the point of inflection. By this, regarding the property curve in the normal usage temperature region as an apparent second-order function temperature property, an adjustment is made so that the local maximum point as the peak temperature of the second-order function temperature property is located in the center of the usage temperature region. If the solid line shown in FIG. 2 is the basic property curve, the property curve is rotated around the point of inflection so that the local maximum point $P_1$ is located in the center of the usage temperature range $T_z$ to obtain a new property curve shown by a broken line. By this, the local maximum point temperature moves from $P_1$ to $P_2$ as if the peak temperature were displaced in the usage temperature range, and the frequency variation rate can be minimized in the usage temperature range.

An ST-cut piezoelectric resonator rotated in plane around the Z' axis is made by first manufacturing an ST-cut quartz wafer, giving an in-plane angle $\Psi$ by utilizing its orienteering flat, and forming with exposure a reflective electrode film and an electrode film of IDT (Interdigital Transducer) in each resonator region. This actual adjustment work of the third-order function temperature property is performed by varying the propagation direction of the elastic surface wave by increasing/decreasing the in-plane angle $\Psi=43$ degrees. The relationship between the direction of change of $\Psi$ and the direction of rotation of the property curve is known in advance and the direction to adjust and the amount to adjust can be predicted to a certain degree. Therefore, an ST-cut piezoelectric resonator rotated in a plane around the Z' axis is made, its temperature property is obtained, the amount of rotation of the property curve is obtained so that the local maximum point or local minimum point becomes located in the center in the usage temperature range according to the design specification, and the adjustment angle $\alpha$ to add to or subtract from $\Psi$ corresponding to this rotation amount is obtained. The starting in-plane angle $\Psi$ corresponding to the orienteering flat is set to an angle of $\Psi\pm\alpha$ to form a reflective electrode film and an electrode film of IDT (Interdigital Transducer). By this, an ST-cut piezoelectric device rotated in plane around the Z' axis which minimizes the frequency variation rate in the usage temperature range can be obtained.

Figure 3:
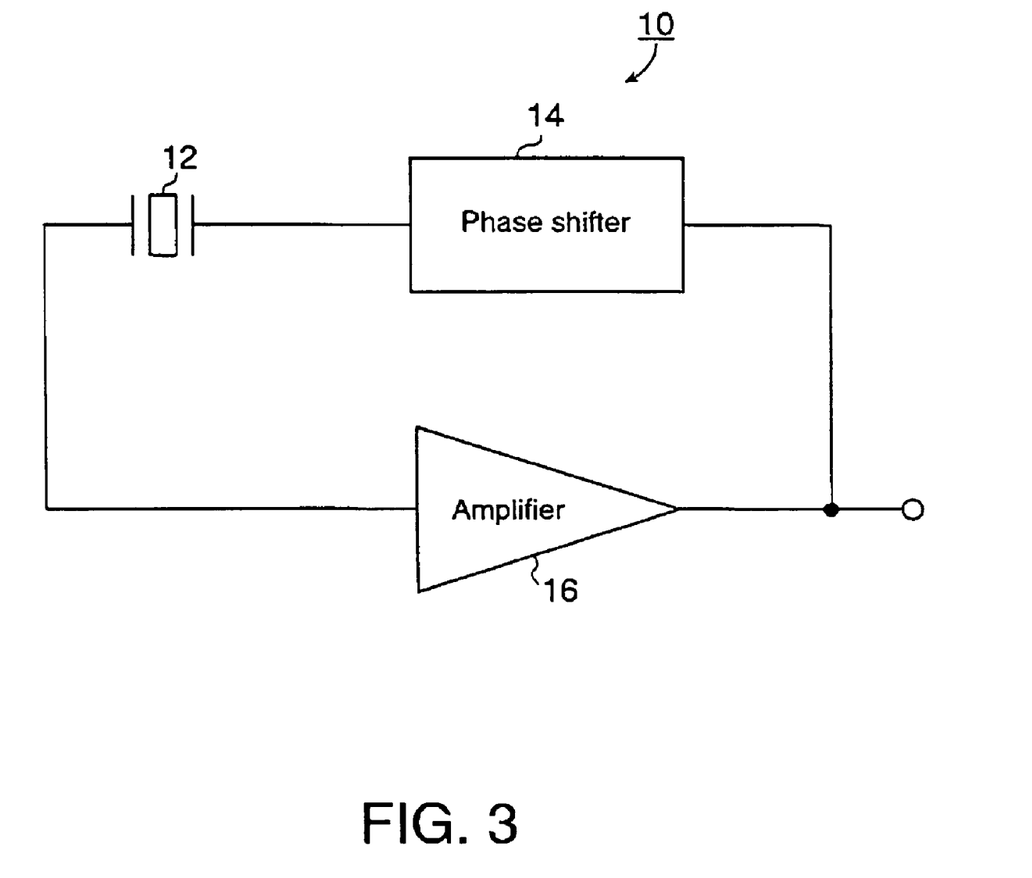
FIG. 3 is a configuration example of an oscillation circuit.
Figure 4:
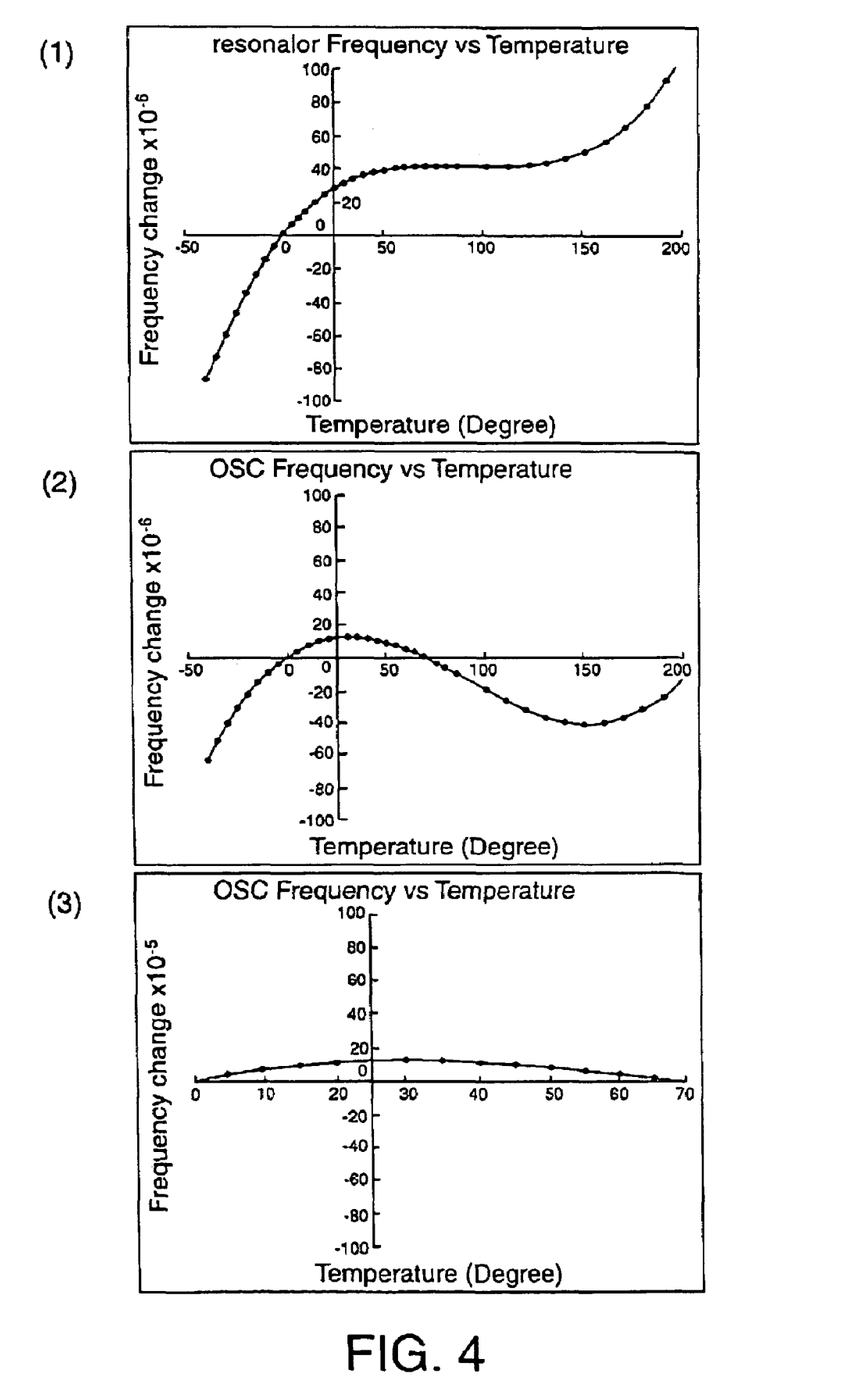
FIG. 4 is a temperature property plot of the piezoelectric resonator of an embodiment and the same when embedded in an oscillator, and its expanded view.

Shown in FIG. 3 is an outline configuration of an oscillation circuit 10 where the ST-cut quartz resonator rotated in a plane around the Z' axis is embedded. This is a configuration example where an amplifier 16 is connected in parallel to a series circuit of a piezoelectric resonator 12 and a phase shifter 14. The temperature property of this oscillation circuit 10 becomes the sum of the temperature property of the resonator 12 and the temperature property of the circuit 10. Shown in FIG. 4 (1) is the temperature property of an ST-cut quartz resonator rotated in plane around the Z axis alone, and shown in (2) of the same figure is the temperature property of an oscillation circuit where this resonator is embedded. Shown in (2) of the same figure is the temperature property of the resonator rotated in the clockwise direction. Because this rotation occurs in an oscillation circuit, foreseeing this, an adjustment is made so that the temperature property in the usage temperature range becomes flat. In this case, the temperature property of the resonator is adjusted so that the temperature property of the oscillation circuit comes to have its apparent peak temperature at the center of the usage temperature range. Namely, the piezoelectric resonator 12 by itself shows a third-order function temperature property as shown in FIG. 4 (1), and when this is embedded in the oscillation circuit 10, the temperature property of the oscillation circuit apparently shows a state where the temperature property is rotated around the point of inflection as shown in FIG. 4 (2). Then, the temperature property of an oscillation circuit whose property becomes flat as shown in FIG. 4 (3) in the temperature range where it is used as the oscillation circuit 10 is determined so that it becomes as shown in FIG. 4 (2), and the temperature property of the piezoelectric resonator 12 is calculated backward to adjust as shown in FIG. 4 (1). Specifically, the property derived by subtracting the temperature property of the oscillation circuit from the desired property becomes the temperature property of the resonator. This temperature property is expressed in a third-order function whose inflection point exists in a higher temperature region than the usage temperature range.

Figure 5:
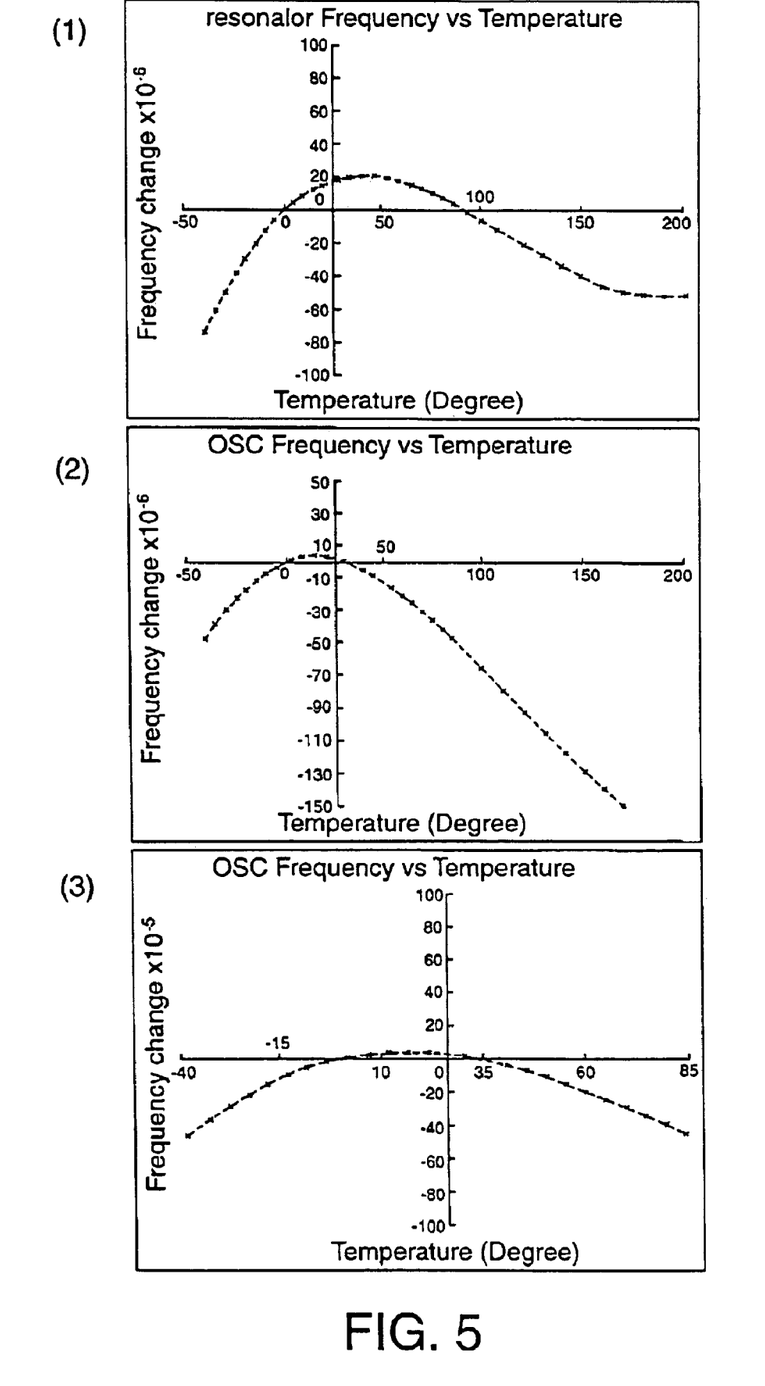
FIG. 5 is a temperature property plot of the piezoelectric resonator of another embodiment and the same when embedded in an oscillator, and its expanded view.

Also, in the case of a different usage temperature range, adjustment is made by foreseeing the temperature property as an oscillation circuit in the same way. Shown in FIG. 5 is the temperature property of a piezoelectric resonator by itself ((1) of the same figure), the temperature property when it is embedded in an oscillation circuit ((2) of the same figure), and an expanded view in the usage temperature range ((3) of the same figure). In this case, adjusting the apparent peak temperature to the center of the usage temperature range can be realized by adjusting the first coefficient of third-order function of the temperature character of the resonator, where the property can be controlled more easily than the adjustment of the peak temperature of a second-order function or the adjustment of the point of inflection temperature of a third-order function.

Figure 6:
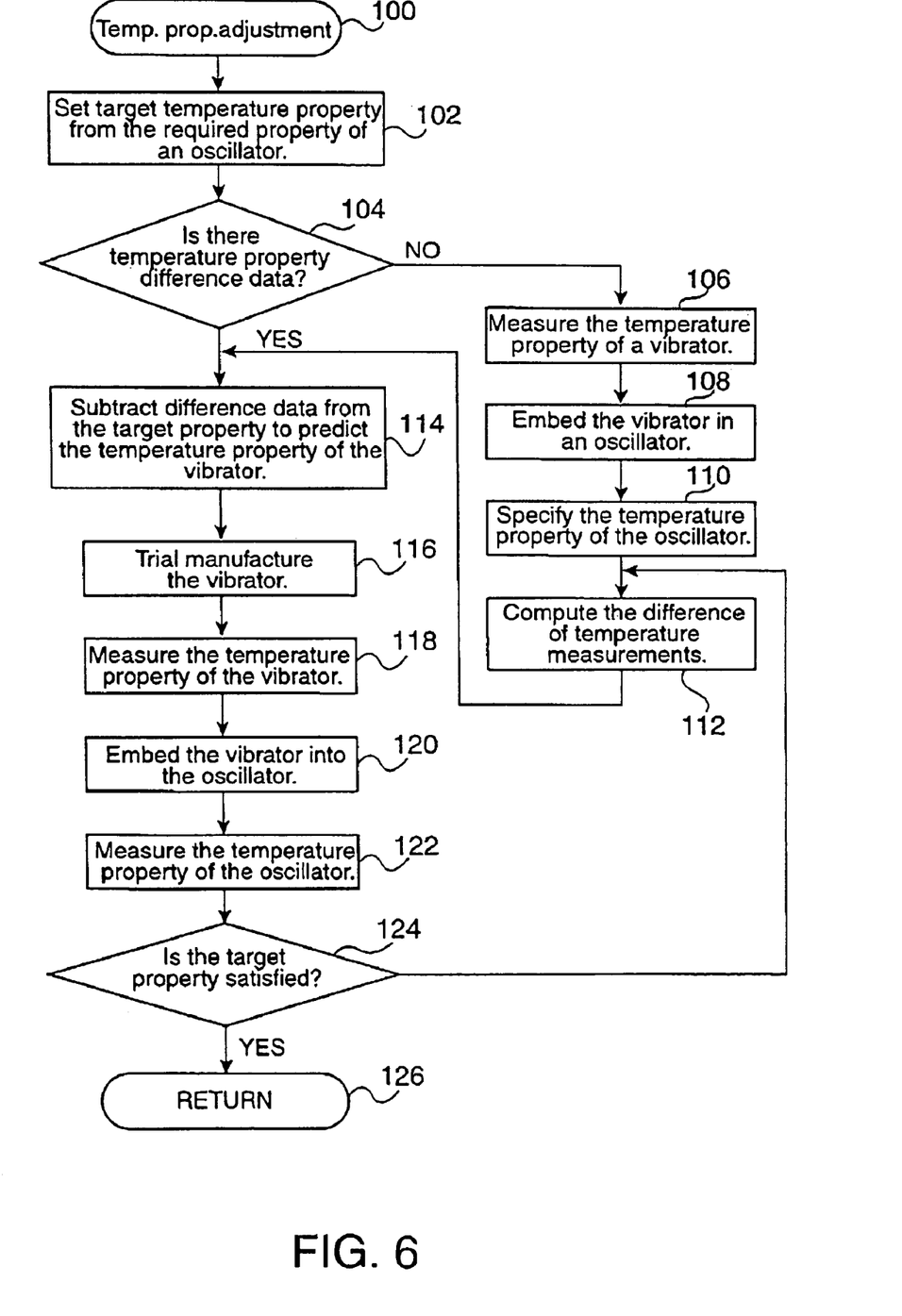
FIG. 6 is a flow chart showing the adjustment work of an oscillator temperature property.

Shown in a flow chart in FIG. 6 is a specific procedure of the temperature property adjustment method when an ST-cut quartz resonator rotated in a plane around the Z' axis is embedded in this kind of oscillation circuit 10. When we enter the temperature property adjustment work (Step 100), first the target temperature property is set from the required property of the oscillator (Step 102). They are a usage temperature range and a tolerable frequency deviation. Then, whether the difference data between the temperature property of the ST-cut quartz resonator rotated in a plane around the Z' axis by itself and as an oscillator is checked (Step 104). If there is no difference data, first the temperature property of the resonator is measured (Step 106). Then, the resonator is embedded in the actual oscillator (Step 108), and the temperature property as an oscillator is measured this time (Step 110). Then, computing the difference in the temperature properties of the two (Step 112), and the difference data is subtracted from the target property to predict the temperature property required for the resonator (Step 114). In the step 106, the so-called reference resonator is created, which may be created for example at an Euler angle of θ=123 degrees and Ψ=43 degrees. Then, the amount of change of the in-plane angle Ψ for making the temperature property required in the step 114 is determined, and a resonator with the propagation direction of elastic surface wave changed is trial manufactured (Step 116). Then, the temperature property is measured, checking whether the temperature property of the resonator has been adjusted to the desired property (Step 118), the resonator is embedded in an oscillator (Step 120), and the temperature property of the oscillator is measured (Step 122). If this satisfied the required property, the resonator is made under the condition of the trial manufacturing in the step 116. If it does not satisfy the requirement (Step 124), we return to the step 112, change the in-plane angle Ψ, and repeat a series of works until the required property is satisfied.

In this way, according to this embodiment, by combining a resonator temperature property and an oscillator temperature property, the local maximum point of temperature property of the resonator can be utilized as the peak temperature in the usage temperature range, and the oscillator temperature property can be adjusted so that the temperature property becomes minimum in the usage temperature range. By making the temperature properties of an amplifier and a phase shifter show different temperature properties from the temperature property of the resonator in the usage temperature range and that the temperature property of the resonator can be improved, the temperature property of the whole oscillator can be improved.

In this case, the temperature property of the resonator is a pseudo second order property in the usage temperature range, and the temperature property of the resonator is a third-order function temperature property. The point of inflection temperature is in a higher temperature range or lower temperature range than the center of the usage temperature range, and a resonator which seems to have a pseudo second order property in the usage temperature range is used.

Although shown in the embodiment is an example where an ST-cut quartz resonator rotated in plane around the Z' axis, it can be applied to any resonator where the temperature property of the resonator shows a pseudo second-order property in the usage temperature range such as a cut whose inflection point exists in a lower temperature region than the usage temperature range.

As explained above, this invention is a method of adjusting the temperature properties of piezoelectric devices which have a third-order function temperature property and the point of inflection of the third-order function temperature property outside the normal usage temperature range, where the local maximum point or local minimum point temperature located in the normal temperature range is regarded as the apparent peak temperature of the second-order function temperature property. Further, the peak temperature is adjusted to the optimum value in the normal temperature range by rotating the temperature property around the point of inflection located outside the normal temperature range by adjusting the first-order coefficient, and also is a method of adjusting the temperature properties of oscillation circuits where embedded is a piezoelectric device which has a third-order function temperature property and an inflection point of the third-order function temperature property outside the normal usage temperature range, which is configured so that the temperature property of the piezoelectric device is measured and the temperature property of the oscillation circuit is also measured to obtain their difference. The resonator temperature property which gives the temperature property required to the oscillation circuit is predicted. The local maximum point or local minimum point temperature located in the normal temperature range of the piezoelectric device is regarded as the peak temperature of an apparent second-order function temperature property so as to give the predicted temperature property, and the temperature property is rotated around the point of inflection located outside the normal temperature range through adjusting the first-order coefficient to adjust the peak temperature to the optimum value in the normal temperature range. Thus the temperature property of the oscillation circuit can be made flatter in the usage temperature range by using the property in the lower temperature range than the point of inflection of the resonator with a third-order function temperature property.

The entire disclosure of Japanese Application No. 2001-217238 filed Jul. 17, 2001 is incorporated by reference.

What is claimed is:

1. A method of adjusting temperature properties of piezoelectric devices which have a third-order function temperature property and a point of inflection of the third-order function temperature property outside a normal usage temperature range comprising:

regarding that at least one of a local maximum point and a local minimum point temperature located in the normal temperature range as an apparent peak temperature of the second-order function temperature property; and adjusting the peak temperature to an optimum value in the normal temperature range by rotating the temperature property around the point of inflection located outside the normal temperature range by adjusting the first-order coefficient.

2. The method of adjusting the temperature properties of piezoelectric devices described in claim 1 wherein the normal temperature range is set to −40 to +85° C.

3. A method of adjusting temperature properties of oscillation circuits having an embedded piezoelectric device which has a third-order function temperature property and an inflection point of the third-order function temperature property outside a normal usage temperature range, the method comprising:

while a temperature property of the piezoelectric device is measured, the temperature property of the oscillation circuit is also measured to obtain a difference value;

predicting a resonator temperature property which becomes a temperature property required for o the oscillation circuit;

regarding at least one of a local maximum point and a local minimum point temperature located in the normal temperature range of the piezoelectric device as a peak temperature of apparent second-order function temperature properties so that the oscillation circuit has the predicted temperature property; and rotating the temperature property around the point of inflection located outside the normal temperature range through adjusting the first-order coefficient to adjust the peak temperature to the optimum value in the normal temperature range.

4. A method of adjusting temperature properties of oscillation circuits comprising:

configuring an oscillation circuit with a lower temperature range than a point of inflection of a third-order function temperature property of a piezoelectric resonator made of an ST-cut quartz plate which is obtained by rotating a quartz plate around an electrical axis (X axis) and further rotated in a plane around a Z' axis; and regarding at least one of a local maximum point and a local minimum point temperature as an apparent peak temperature of a second-order function temperature property to adjust a frequency property of the oscillation circuit.

5. A method of adjusting temperature properties of oscillation circuits having an embedded ST-cut quartz plate obtained by rotating a quartz plate around an electrical axis (X axis) and further rotated in a plane around a Z' axis comprising:

obtaining temperature properties of the ST-cut quartz plate and the oscillation circuit; and adjusting the temperature property of the ST-cut quartz plate rotated in plane so that a difference in temperature properties is canceled.

6. The method of adjusting the temperature properties of oscillation circuits described in claim 5 wherein a usage temperature range of the oscillation circuit is −40 to +85° C.

7. A piezoelectric device comprising adjusted temperature properties formed according to the method of claim 1.

8. An oscillation circuit comprising adjusted temperature properties formed according to the method of claim 3.

9. An oscillation circuit comprising adjusted temperature properties formed according to the method of claim 4.

10. An oscillation circuit comprising adjusted temperature properties formed according to the method of claim 5.

* * * * *